US00RE42776E

(19) United States
(12) Reissued Patent
Clark et al.

(10) Patent Number: US RE42,776 E
(45) Date of Reissued Patent: Oct. 4, 2011

(54) TAP CONNECTIONS FOR CIRCUITS WITH LEAKAGE SUPPRESSION CAPABILITY

(75) Inventors: Lawrence T. Clark, Phoenix, AZ (US); Vikas R. Amrelia, Gilbert, AZ (US); Raphael A. Soetan, Chandler, AZ (US); Eric J. Hoffman, Chandler, AZ (US); Tuan X. Do, Chandler, AZ (US)

(73) Assignee: Marvell International Ltd., Hamilton (BM)

(21) Appl. No.: 11/802,556

(22) Filed: May 23, 2007

Related U.S. Patent Documents

Reissue of:
(64) Patent No.: 6,388,315
Issued: May 14, 2002
Appl. No.: 09/941,829
Filed: Aug. 29, 2001

U.S. Applications:
(62) Division of application No. 09/464,023, filed on Dec. 15, 1999, now Pat. No. 6,368,933.

(51) Int. Cl.
*H01L 23/52* (2006.01)

(52) U.S. Cl. ..... 257/691; 257/204; 257/206; 257/207; 257/208; 257/369; 257/371; 257/E21.63; 257/E27.107; 257/E27.108; 257/E27.067; 257/355; 257/356; 257/357; 257/358; 257/360; 257/363; 257/291; 257/338

(58) Field of Classification Search ..... 257/204, 257/206, 207, 208, 369, 371, 691, E21.63, 257/E27.107, E27.108, E27.067, 291, 338, 257/355–358, 360, 363
See application file for complete search history.

(56) References Cited

U.S. PATENT DOCUMENTS

| | | | | |
|---|---|---|---|---|
| 5,488,247 | A * | 1/1996 | Sakurai | 257/368 |
| 5,492,856 | A | 2/1996 | Ikeda et al. | |
| 5,576,570 | A * | 11/1996 | Ohsawa et al. | 257/369 |
| 5,610,550 | A * | 3/1997 | Furutani | 327/543 |
| 6,005,797 | A * | 12/1999 | Porter et al. | 365/156 |
| 6,157,070 | A | 12/2000 | Lin et al. | |
| 6,376,287 | B1 * | 4/2002 | Dennison et al. | 438/158 |

OTHER PUBLICATIONS

Robert F. Pierret, "Semiconductor Device Fundamentals with Computer-Based Exercises Homework Problems," pp. 680-681.
Neil H. E. Weste Kamran Eshraghian, "Principles of CMOS VSLI Design, a Systems Perspective," 2nd Ed., pp. 51, 54-55.

* cited by examiner

*Primary Examiner* — Andy Huynh

(57) ABSTRACT

An integrated circuit biases the substrate and well using voltages other than those used for power and ground. Tap cells inside the standard cell circuits are removed. New tap cells used to bias the substrate and well reside outside the standard cell circuits. The location of the new voltage power rails is designated prior to placement of the tap cells in the integrated circuit. The tap cells are then strategically placed near the power rails such that metal connections are minimized. Circuit density is thus not adversely impacted by the addition of the new power rails. Transistors are also placed inside the tap cells to address electrostatic discharge issues during fabrication.

8 Claims, 14 Drawing Sheets

TAP CONNECTIONS FOR CIRCUITS WITH LEAKAGE SUPPRESSION CAPABILITY

Matter enclosed in heavy brackets [ ] appears in the original patent but forms no part of this reissue specification; matter printed in italics indicates the additions made by reissue.

This is a divisional of prior application Ser. No. 09/464,023 filed on Dec. 15, 1999 *now U.S. Pat. No. 6,368,933*.

BACKGROUND

This invention relates to semiconductors and, more particularly, to semiconductor fabrication.

Semiconductors form the basis of most integrated circuits. Integrated circuits are typically built from standard cell circuits. A standard cell circuit may include an AND gate, a NAND gate, or an inverter, to name just a few.

Each standard cell circuit is typically made up of a number of transistors. An integrated circuit may therefore include hundreds, thousands, or even millions of transistors.

The processes used to manufacture semiconductors employ smaller and smaller line Widths and features which are scaled down in order to increase the number of transistors per die. Furthermore, the power supply levels are collapsed to lower and lower voltages. For deep sub-micron processes, power supply levels may be decreased to keep electrical or electromagnetic fields from punching through the channel region of the transistors. These deep sub-micron processes may be employed, for example, in digital signal processing, or DSP, applications such as cellular technology, to minimize battery discharge levels.

Such deep sub-micron processes, however, leak current while the transistors are off because the threshold voltages for -these devices are lowered. As the leakage current increases, the power consumed (or, more correctly, wasted) by the leaking transistor also increases.

To address the leakage problem, additional voltage supply rails may be added to the integrated circuit design. The supply rails may be used to reverse-bias the bulk-to-source junction of the transistor, for example. However, the additional power rails may present other challenges for the design of the integrated circuit.

Thus, there is a continuing need for an efficient design of an integrated circuit which includes additional power rails.

SUMMARY

In accordance with one embodiment of the invention, a method includes indicating a location for a power rail to supply a potential, assigning the power rail to a well of a first type, and placing a plurality of connections such that the well of the first type has the first potential.

Advantages and other features of the invention will become apparent from the following description, the drawings, and the claims.

DETAILED DESCRIPTION

Figure 1:
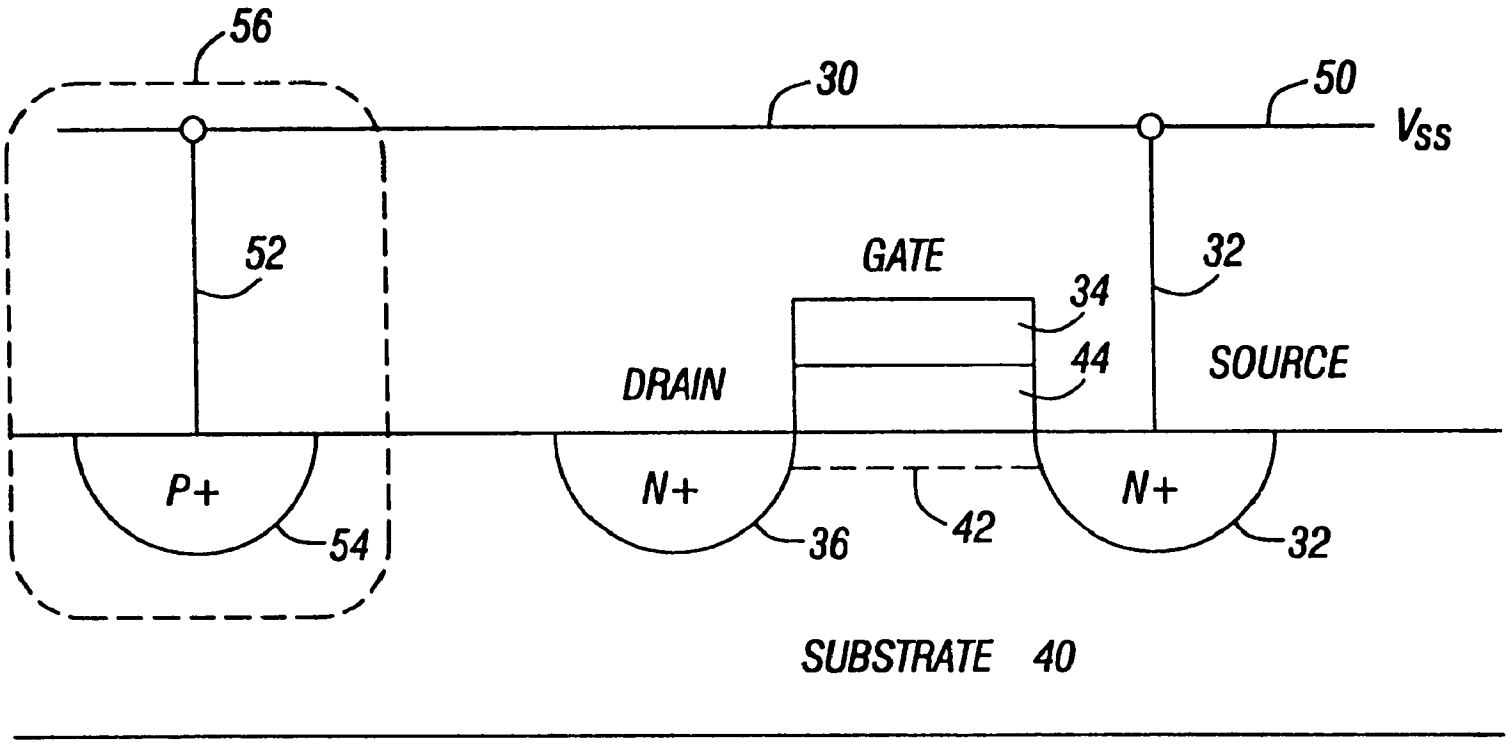
FIGURE 1 (PRIOR ART)
FIG. 1 is a diagram of an n-type MOSFET device of the prior art.

In FIG. 1, an n-type metal-oxide-semiconductor field-effect transistor, or MOSFET, 30 of the prior art is formed in a p-type substrate 40 and includes a source 32, a drain 36, and a gate 34. The source 32 and the drain 36 are comprised of a pair of heavily doped n-type regions, formed in the p-type substrate 40. The gate 34 is formed on top of a gate dielectric 44. When a voltage is applied to the gate 34, electrons may travel from the source region 32 to the drain region 36 through a channel 42.

A bulk terminal 54 is a heavily doped p-type region which is formed in the p-type substrate 40. The bulk terminal 54 sets the potential of the p-type substrate 40, ostensibly to prevent leakage from the source region 36 and the drain region 32. The bulk terminal 54 is known as a tap cell 56 or a spacer cell 56.

The tap cell 56 is used to set the potential of the substrate 40, to prevent leakage from the source region 36 and the drain region 32 into the p-type substrate 40. The tap cell 56 of FIG. 1 is also known as a "substrate tap."

A power rail 50, with a potential, $V_{ss}$ is connected both to the source 32 and the bulk terminal 54. The voltage between the source 32 to the bulk terminal 54, or $V_{sb}$, for the transistor 30 is thus close to zero.

Figure 2:
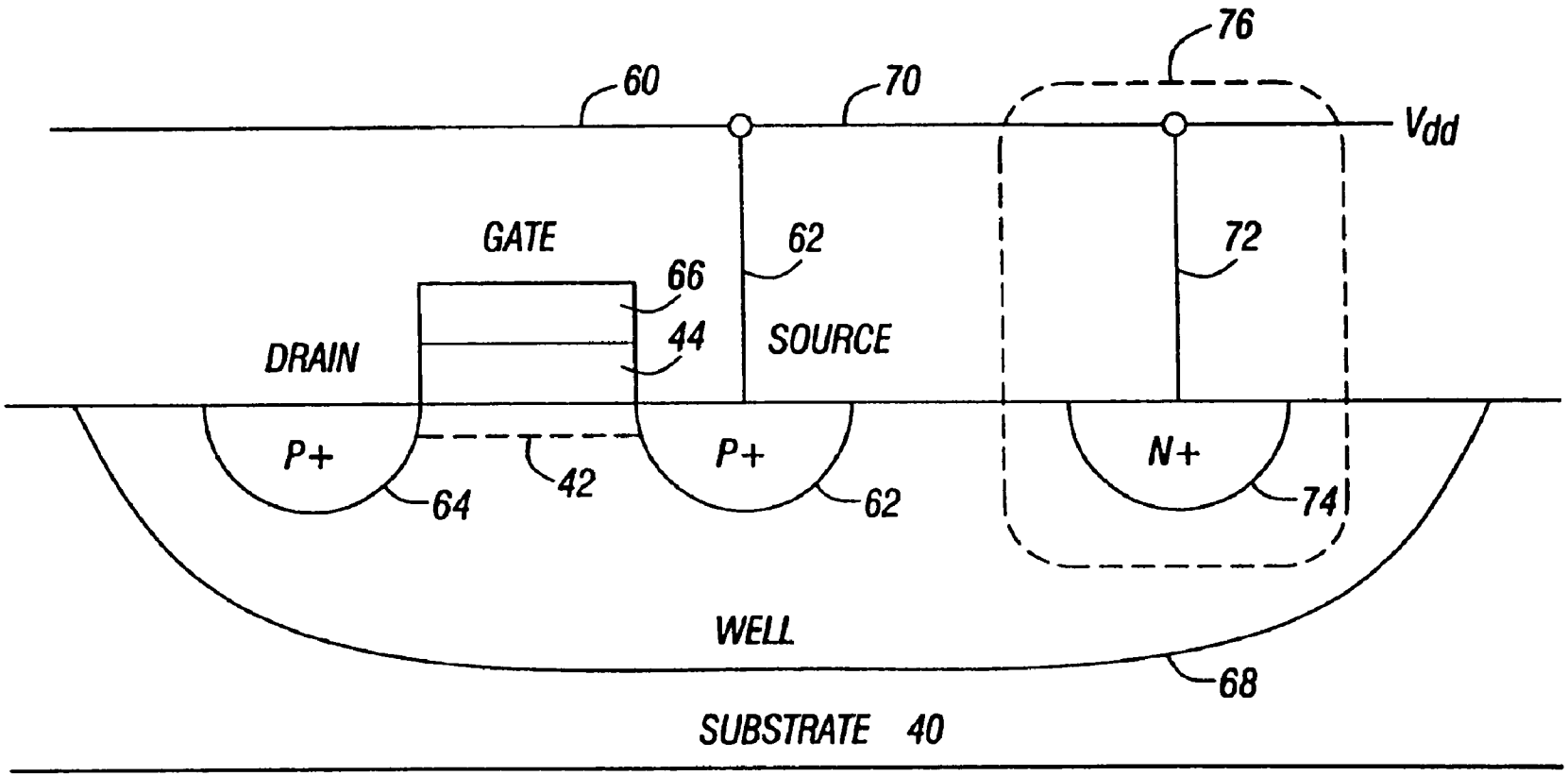
FIGURE 2 (PRIOR ART)
FIG. 2 is a diagram of a p-type MOSFET device of the prior art.

In FIG. 2, a p-type MOSFET 60 of the prior art is also formed in the substrate 40. An n-type well 68 is added to the p-type substrate 40, however, prior to forming a source 62, a drain 64, and a gate 66. The source 62 and the drain 64 are comprised of two heavily doped p-type regions, which are formed into the n-type well 68. The gate 66 is formed on top of the gate dielectric 44, and includes the channel 42 for electrons to travel between the source 62 and the drain 64.

A bulk terminal 74 is a heavily doped n-type region formed into the n-type well 68. The bulk terminal 74 sets the potential of the n-type well 68, to minimize leakage from the source region 62 and the drain region 64 into the p-type well 68. Like the bulk terminal 56, the bulk terminal 74 is also a tap cell, known as a "well tap."

A second power rail 70, with a potential, $V_{dd}$, is connected to both the source 62 and the bulk terminal 74. The voltage between the source 62 to the bulk terminal 74, or $V_{sb}$, for the transistor 60 is thus close to zero.

An integrated circuit may include many logic circuits which are built from both n-type MOSFETs 30 and p-type MOSFETs 60. For example, a logic complementary metal-oxide-semiconductor, or CMOS, inverter may be formed by connecting the gates of both an n-type MOSFET 30 and a p-type MOSFET 60. In operation, one transistor is biased on while the other transistor is biased off.

When the source-to-drain voltage ($V_{sd}$) across a deep sub-micron CMOS device is at the full rail value and the voltage between the source and the bulk ($V_{sb}$) of the device is zero volts, leakage from the CMOS device may be considerable.

To address this phenomenon, the source-to-bulk voltage, $V_{sb}$, may be adjusted such that $V_{sb}$ is no longer zero. For an n-type device, if a positive $V_{sb}$ is created, then a body effect is induced. Body effect is the variation in the threshold voltage, $V_t$, resulting from a change to the source-to-bulk voltage, $V_{sb}$. Thus, by increasing $V_{sb}$, an increase in the threshold voltage ($V_t$) of the device may result. Persons of ordinary skill in the art will recognize that sub-threshold leakage has a strong inverse exponential relationship to $V_t$. Therefore, this increase in the threshold voltage, $V_t$, causes the sub-threshold leakage to drop dramatically.

Likewise, for p-type devices, the source-to-bulk voltage, $V_{sb}$, may be made negative. Accordingly, a body effect for the p-type device is invoked, thus increasing the value of the threshold voltage, $V_t$, of the device. The sub-threshold leakage of the p-type device may thus be reduced.

Figure 3:
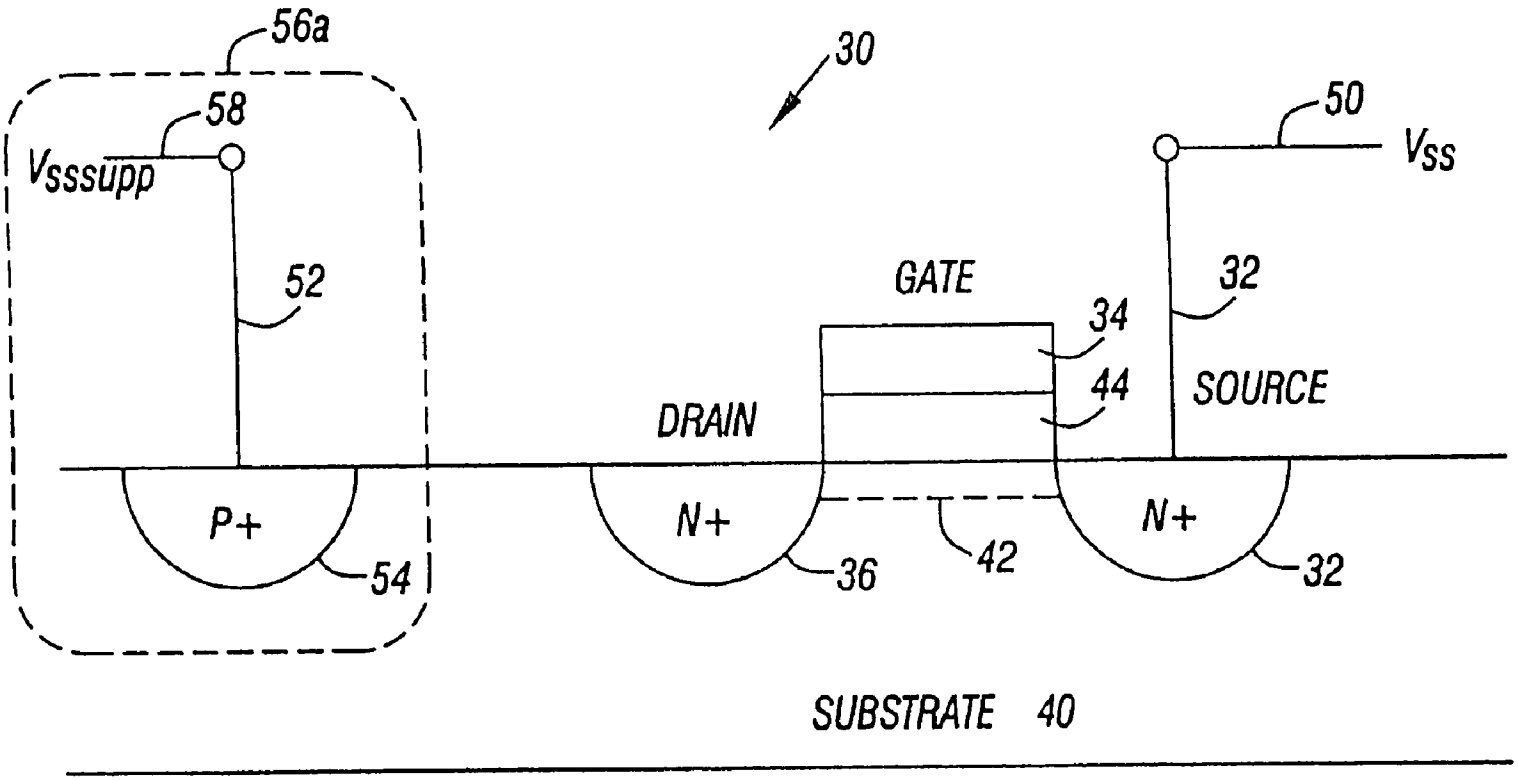
FIGURE 3 (PRIOR ART)
FIG. 3 is a diagram of a second n-type MOSFET device of the prior art.

In FIG. 3, for example, the n-type MOSFET 30 of FIG. 1 remains unchanged. However, a substrate tap cell 56a replaces the substrate tap cell 56 by coupling the bulk terminal 54 to a power rail 59, with potential, $V_{sssupp}$. As a result, the voltage $V_{sb}$ of the n-type MOSFET 30 is non-zero because the source 32 is tied to the power rail 50, with potential, $V_{ss}$, while the bulk terminal 54 is tied to the power rail 58, with potential, $V_{sssupp}$. Accordingly, the threshold value, $V_t$ may increase, with an associated decrease in current leakage from the n-type MOSFET 30. In one embodiment of the invention, the voltage $V_{sssupp}$ 58 is a lower voltage than $V_{ss}$ 50.

Figure 4:
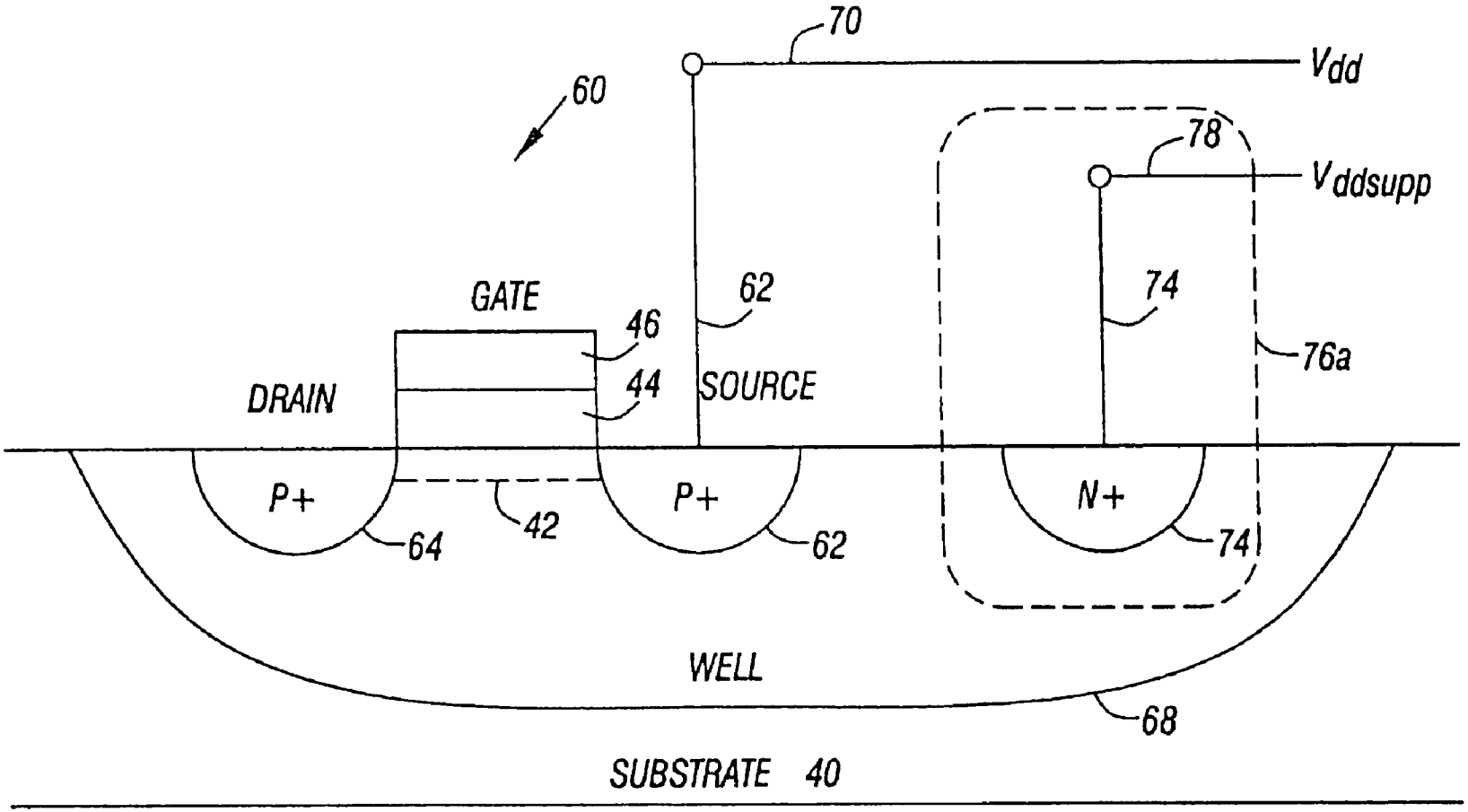
FIGURE 4 (PRIOR ART)
FIG. 4 is a diagram of a second p-type MOSFET device of the prior art.

Likewise, in FIG. 4, the p-type MOSFET 60 of FIG. 2 is unchanged. Instead, a well tap cell 76a replaces the well tap cell 76 by coupling the bulk terminal 74 to a power rail 78, with potential, $V_{ddsupp}$. The source 62 of the p-type MOSFET 60 is coupled to the power rail 70, with potential $V_{dd}$, making the bulk-to-source voltage, $V_{sb}$, of the p-type MOSFET 60 non-zero. Accordingly, the threshold voltage, $V_t$, for the p-type MOSFET 60 may increase, with an associated decrease in current leakage. In one embodiment of the invention, the voltage $V_{ddsupp}$ is a more positive voltage than $V_{dd}$.

In an integrated circuit which includes the power rails 50 and 70, for example, each cell circuit may be connected to both power rails. Such may be the case in a CMOS cell circuit, for example. The substrate tap 56 of FIG. 1 connects the power rail 50 to the p-type substrate 40. Each and every cell circuit may thus incorporate a substrate tap 56 by forming a heavily doped p-type region 54 into the p-type substrate 40 of that cell circuit. A metal line 52 connects to each cell circuit to connect to the power rail 50. Accordingly, the metal line 52 may readily be extended to the heavily doped p-type region 54. The heavily doped p-type region 54 is added without extending the cell circuit area and with minimal use of metal.

Likewise, a well tap 76 may be available to every p-type MOSFET 60 in a CMOS integrated circuit design, for example. A heavily doped n-type region 74 may be formed into the n-type well 68 which may traverse a number of p-type MOSFETs 60. Since the power rail 70 is connected to every cell circuit, a metal line 72 may be connected from the power rail 70 to the heavily doped n-type region 74. The heavily doped n-type region 74 is added without extending the cell circuit area and with minimal use of metal.

The two additional power rails 58 and 78, however, are not supplied to the standard cell circuits of the integrated circuit. Thus, in one embodiment of the invention, the tap cells 56 are removed from each cell circuit. Alternatively, the metal connected to the tap cells 56, either the metal line 72 connected to the heavily doped n-type region 72 for the well tap 76 or the metal line 52 connected to the heavily doped p-type region 52 for the substrate tap 56, may be removed from the design of each cell circuit.

Once removed from the design as part of the cell circuits, substrate tap cells 56a and well tap cells 76a may be included in the integrated circuit design. Because $V_{sssupp}$ and $V_{ddsupp}$ are not supplied to the cell circuits, the new tap cells 56a and 76a may be placed outside the cell circuits. Substrate tap cells 56a may be connected to $V_{sssupp}$ while well tap cells 76a may be connected to $V_{ddsupp}$, as needed, throughout the integrated circuit.

A single substrate tap cell 56a may set the potential of the p-type substrate 40 for some distance, biasing the substrate 40 for a number of cell circuits. Likewise, a single well tap cell 76a may bias the n-type well 68 for many cell circuits. In one embodiment of the invention, tap cells placed approximately 55 microns apart are effective to bias the substrate 40 and the well 68.

Because the tap cells are no longer contained inside the cell circuits, they may no longer be "close" to the associated power rails. Thus, metal lines 52 and 72 connect the power rails 58 and 78 to the tap cells 56a and 76a, respectively. However, the amount of metal available for connection between the various components of the integrated circuit is finite and, in some cases, may be a constraint on the available size of the circuit.

Typically, in designing integrated circuits, it is desirable to minimize the track length, e.g., the amount of metal used to connect circuits. Short tracks are generally less susceptible to interference and cross-talk, have lower parasitic reactances, and radiate less energy.

Figure 5:
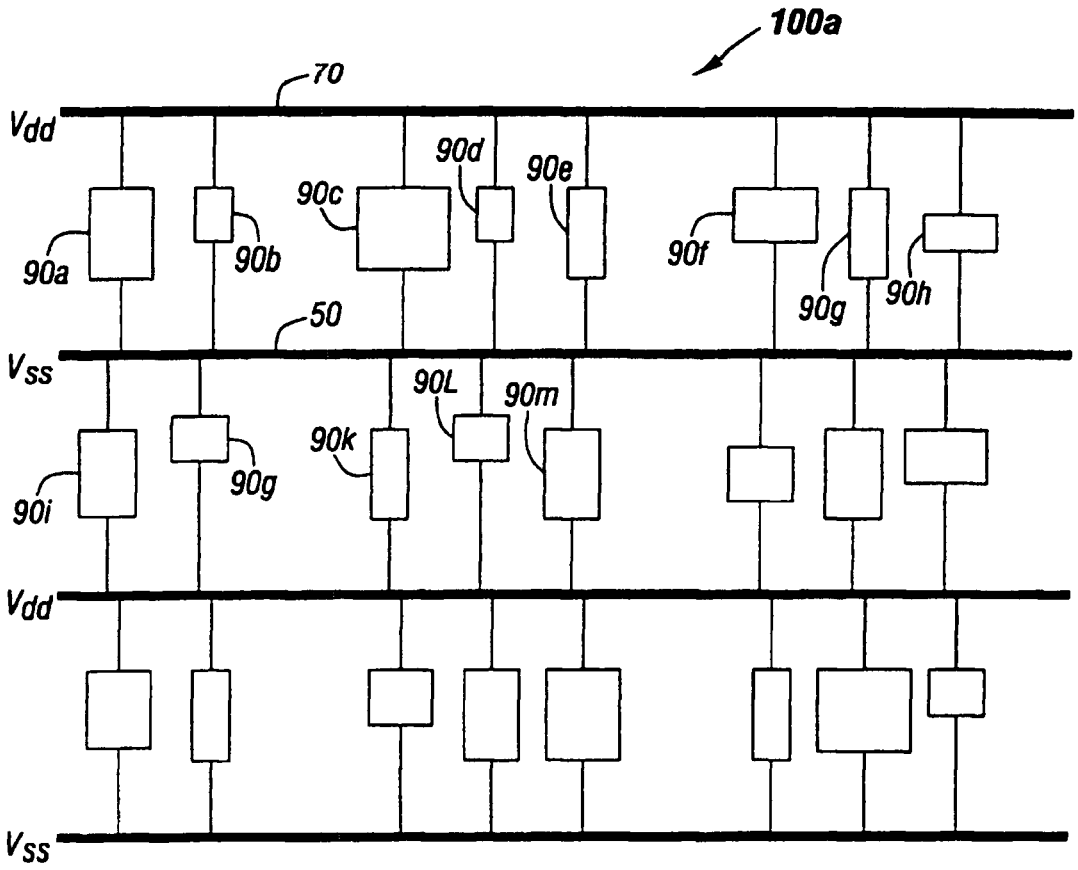
FIG. 5 is a diagram of an integrated circuit including a plurality of standard cell circuits according to one embodiment of the invention.

In FIG. 5, a plurality of standard cells 90 make up an integrated circuit 100a. A standard cell is a reusable cell design for accomplishing a given circuit function. Recall that the standard cell circuits 90 may represent a number of different types of devices. For example, the cell circuit 90a may be an AND gate, a NAND gate, or an inverter. Each cell circuit 90 may include a number of p-type 60 and n-type 30 transistors.

In the integrated circuit 100a, each standard cell 90 is connected to both the power rails 50 and 70. These connections supply the voltages for operation of the transistors inside each standard cell circuit 90.

In order for connections between circuits to be made, regions are etched out of layers of the various semiconductor materials. Metal is then placed in the etched regions, such that components may be connected. The metal is typically fabricated in multiple layers, known as M1, for the first metal layer, M2, for the second metal layer, and so on. The metal layers may be connected by vertical connections, known as vias.

Figure 6:
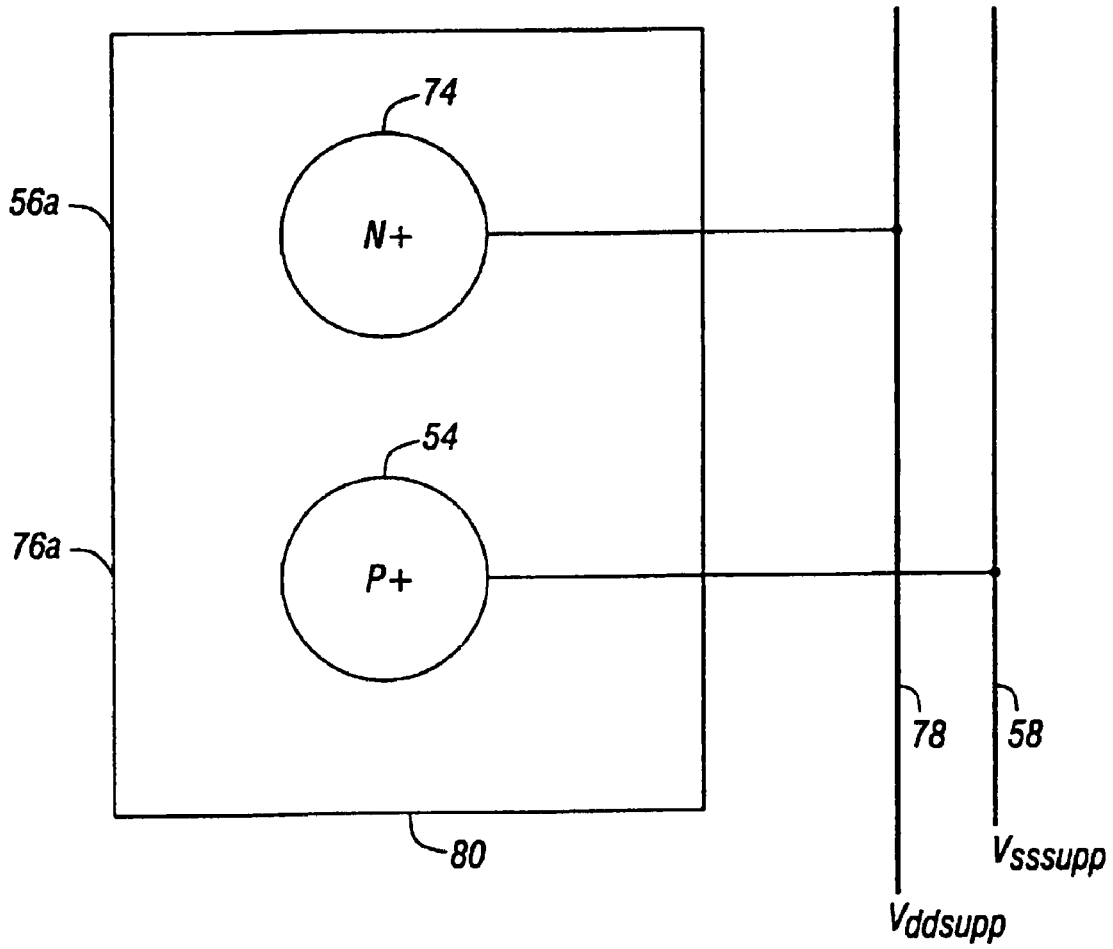
FIG. 6 is a diagram of a tap cell according to one embodiment of the invention.

In FIG. 6, a tap cell 80 according to one embodiment of the invention, includes both the substrate tap 56a and well tap 76a of FIGS. 3 and 4, respectively. In the well tap [56a] *76a*, the heavily doped n-type region 74 is connected to the power rail 78. Likewise, for the substrate tap [76a] *56a*, the heavily doped p-type region 54 is connected to the power rail 58.

As described above, the well tap [56a] *76a* biases the n-type well 68 (FIG. 4) to $V_{ddsupp}$. The substrate tap [76a] *56a* biases the p-type substrate 40 (FIG. 3) to $V_{sssupp}$. Although the well tap cell [56a] *76a* and the substrate tap cell [76a] *56a* together form the tap cell 80, the two tap cells 56a and 76a may be separated from one another in the integrated circuit.

Figure 7:
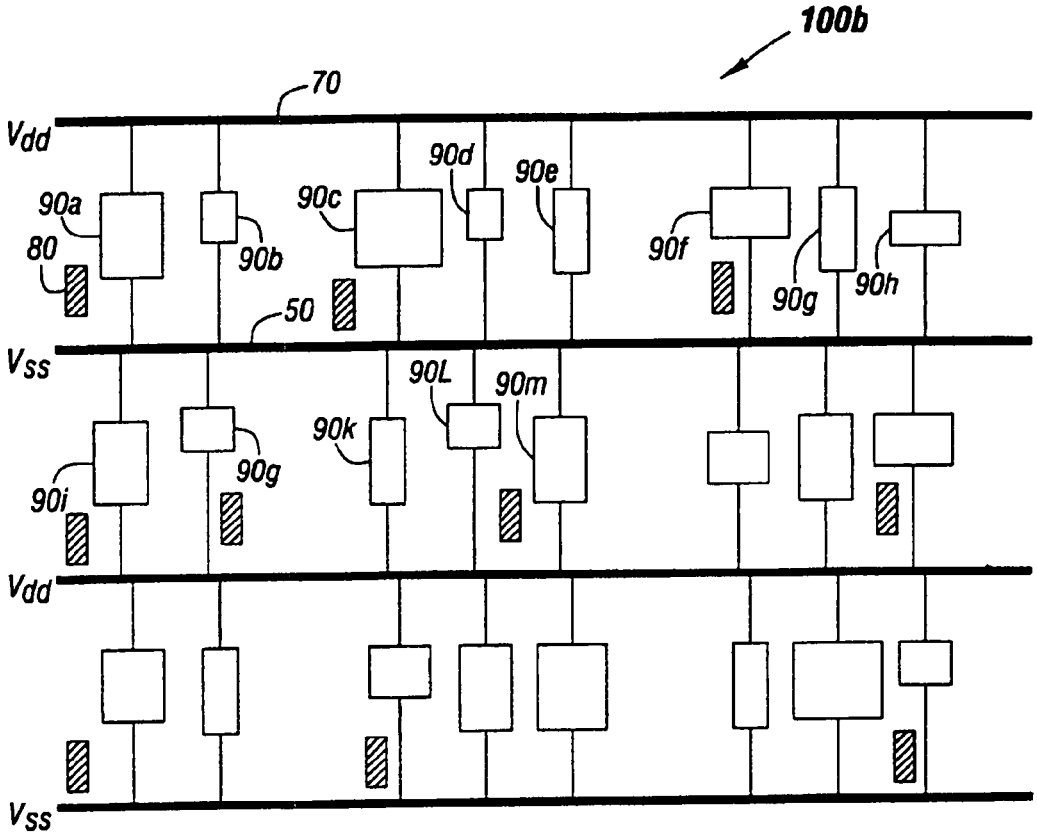
FIG. 7 is a diagram of the integrated circuit of FIG. 5, including a plurality of tap cells according to one embodiment of the invention.
Figure 8:
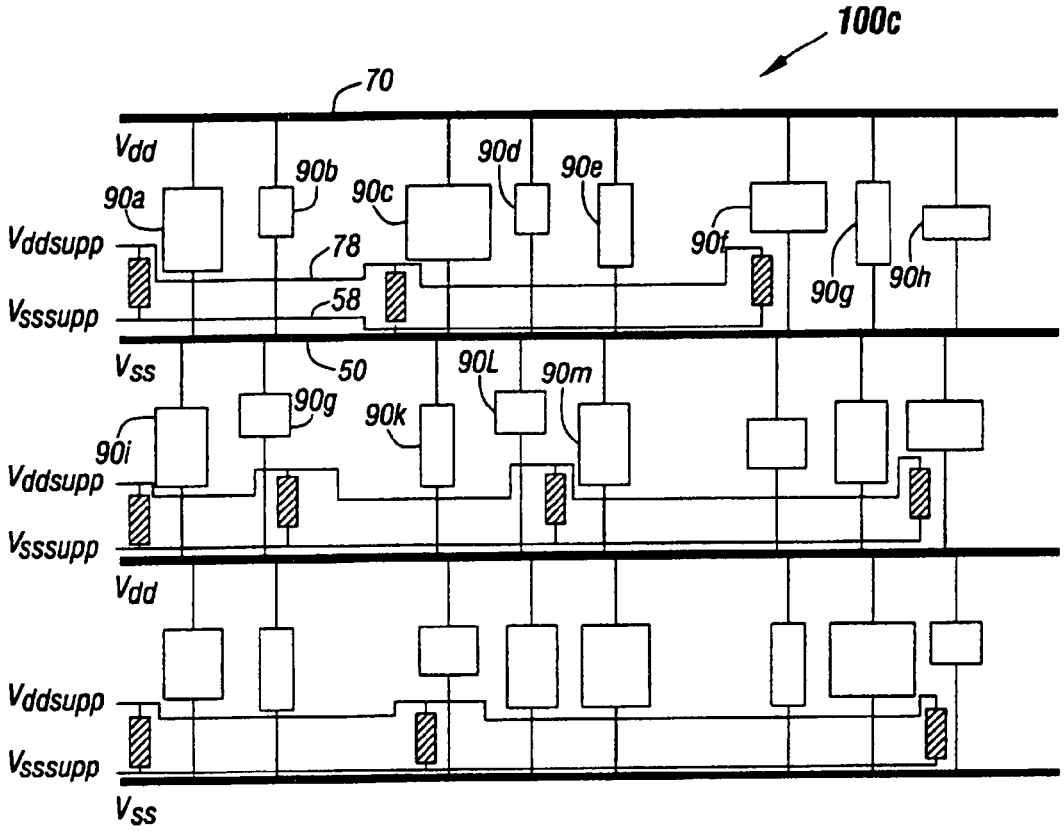
FIG. 8 is a diagram of the integrated circuit of FIG. 7, including power connections to the tap cells according to one embodiment of the invention.

In FIG. 7, an integrated circuit 100b includes a plurality of tap cells 80, scattered throughout the design. The integrated circuit designer may employ a computer program such as an automatic placement and routing tool in order to position the tap cells 80. The tap cells 80 themselves may be small relative to the other standard cell circuits 90, and may not impact the overall density of the integrated circuit 100b in one embodiment of the invention. The automatic placement and routing tool or other automated program may place the tap cells 80 in a somewhat random fashion throughout the integrated circuit 100b. The tap cells 80 may be connected to the voltages, $V_{sssupp}$ and $V_{ddsupp}$, such as in the integrated circuit 100c of FIG. 8.

Figure 9:
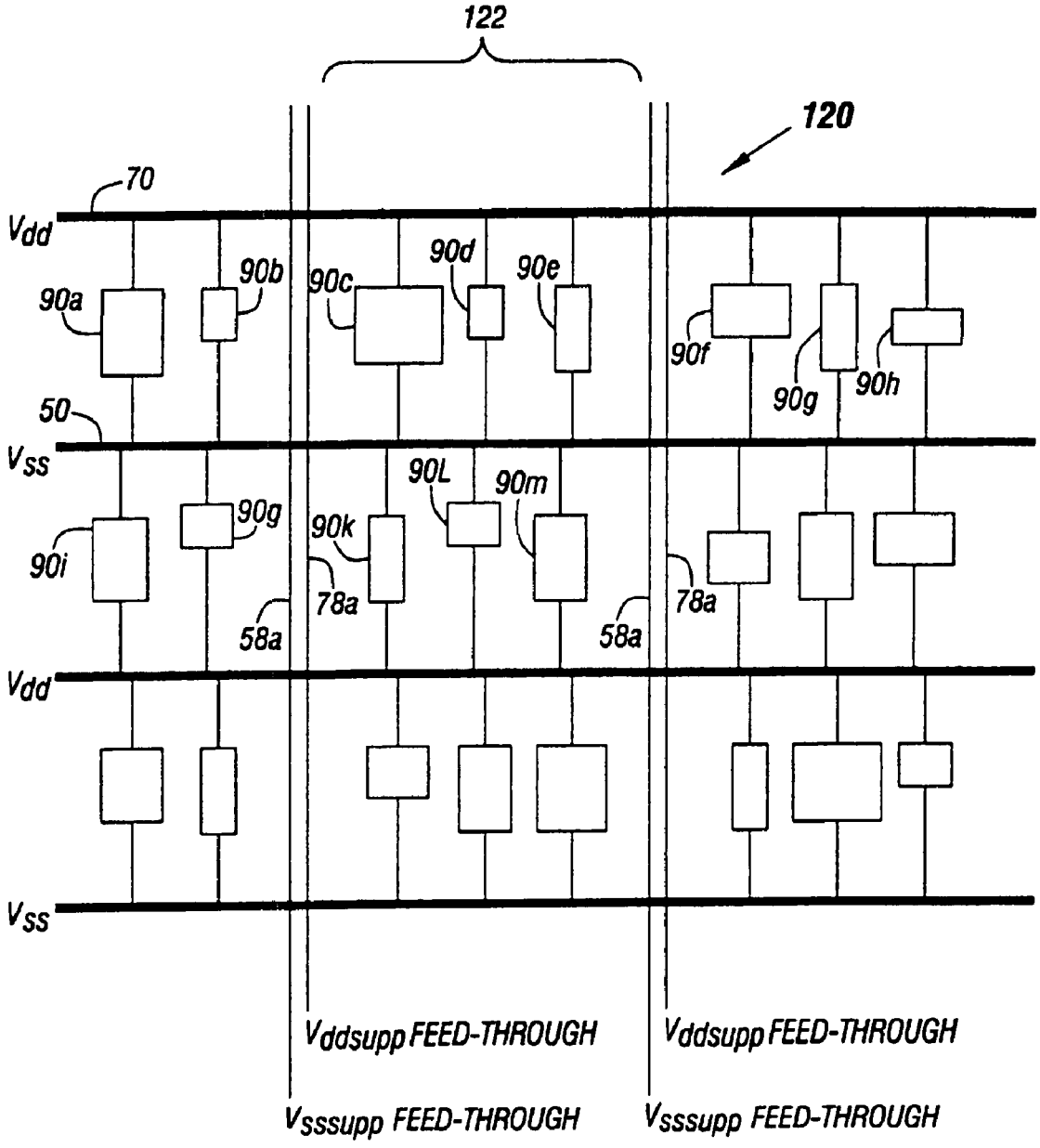
FIG. 9 is a diagram of an alternative configuration of the integrated circuit of FIG. 8 according to one embodiment of the invention.

In FIG. 9, according to one embodiment of the invention, one or more feed-throughs 58a for the power rail 58 are placed in parallel to one another through an integrated circuit 120, prior to any placement of tap cells 80. Likewise, one or more feed-throughs 78a for the power rail 78 are placed in parallel to one another and parallel to the feed-throughs 58a.

Feed-throughs are pre-determined routes for the placement of designated signals, such as the power rails 58 and 78. Instead of leaving the placement of the tap cells 80 to be determined by the automatic placement tool, the feed-throughs 58a and 78a indicate where the power rails 58 and 78 will subsequently be placed. Because the automatic placement tool "knows" where the power rails 58 and 78 will be, the tool may place the tap cells 80 close to these power rails 58 and 78. The effect is to avoid excessive use of metal for connection between the tap cells 80 and the power rails 58 and 78.

The separate feed-throughs 58a for the voltage $V_{sssupp}$ 58 are placed a distance 122 apart. The feed-throughs 78a for the voltage $V_{ddsupp}$ 78 may likewise be placed the distance 122 apart. In one embodiment of the invention, the distance 122 is approximately 55 microns. Recall that the tap cells 80 may be optimally placed about 55 microns apart to effectively bias the substrate 40 and the well 68. Thus, the placement of the feed-throughs 58a and 78a may result both in fewer tap cells 80 and in shorter metal lines for routing to the tap cells 80.

Figure 10:
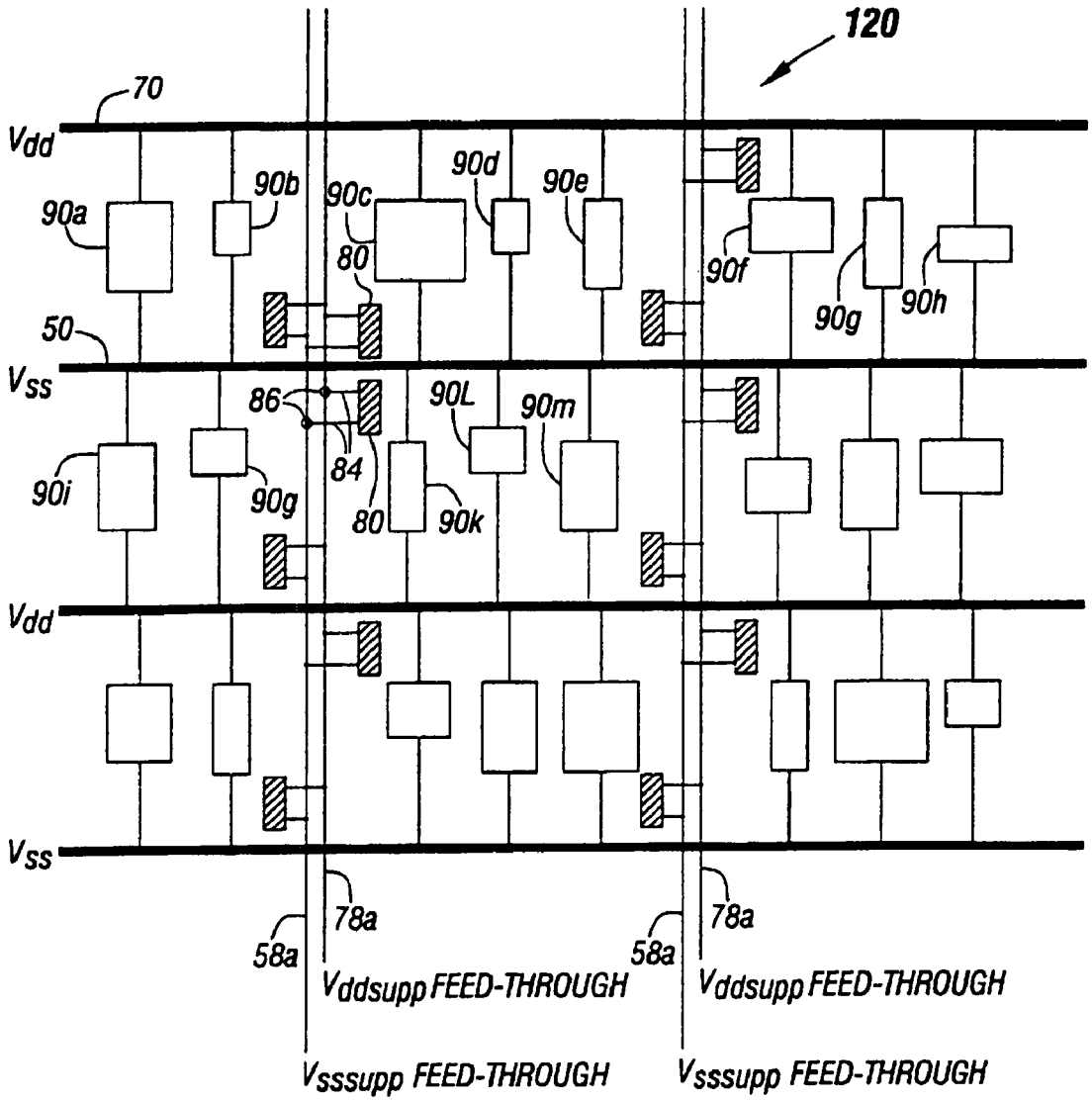
FIG. 10 is a diagram of the integrated circuit of FIG. 9 including power connections to the tap cells according to one embodiment of the invention.

In FIG. 10, a plurality of tap cells 80 are placed in the integrated circuit 120 following the placement of the feed-throughs 58a and 78a. By designating the location of the power rails 58 and 78 ahead of the placement of the tap cells 80, an automatic routing tool or other computer-implemented mechanism may strategically place the tap cells 80. The resulting use of metal for connecting the tap cells to the $V_{sssupp}$ and the $V_{ddsupp}$ signals may thus be reduced.

In FIG. 10, the power rails 50 and 70, which provide current to each standard cell 90, are typically thick relative to other metal lines. In one embodiment of the invention, the power rails 50 and 70 may be 5 microns wide. Because the power rails 58 and 78 do not in general provide current, but rather only bias conditions for the n-type well 68 and the p-type substrate 40, these two power rails 58 and 78 may be routed without excessive use of metal. In one embodiment of the invention, the power rails 58 and 78 may be 0.84 microns wide to properly bias the n-type well 68 and the p-type substrate 40.

In one embodiment of the invention, the $V_{sssupp}$ and the $V_{ddsupp}$ signals are routed in the metal 3 layer rather than in the metal 2 layer. The metal 2 layer may thus be reserved for the primary $V_{ss}$ and $V_{dd}$ signals, which are thicker and which provide power to each cell circuit 90.

A typical integrated circuit may include multiple metal layers. For example, a circuit may include a first metal layer, M1, a second metal layer, M2, a third metal layer, M3, a fourth metal layer, M4, a fifth metal layer, MS, and so on, as needed.

Each metal layer may be thought of as a sheet of metal, with all layers being parallel to one another. However, the metal lines for each layer may run orthogonally to the metal lines for adjacent layers. Thus, if the metal lines in M1 run in one direction, the metal lines in M2 run orthogonally to the metal lines in M1, and the metal lines in M3 run orthogonally to the metal lines in M2, which are thus parallel to the metal lines in M1. The different metal layers may be connected, as needed, by vias. Vias are vertical connections between the metal layers.

In FIG. 10, a plurality of metal lines 84 connect the tap cells 80 to the power rails 58 and 78. In one embodiment of the invention, the metal lines 84 routed in the M2 layer are parallel to the power rails 50 and 70. The power rails 58 and 78 may be routed in the M3 layer and are laid orthogonal to the M2 routes. When the tap cells 80 are placed close to the M3 feed-throughs 58a and 78a, relatively short M2 routes 84 connect the tap cells 80 to the power rails 58 and 78. This use of M2 routes for the $V_{sssupp}$ and the $V_{ddsupp}$ signals may not excessively affect circuit density. A plurality of vias 86 provide a vertical connection between the M2 routes 84 and the power rails 58 and 78.

Figure 11A:
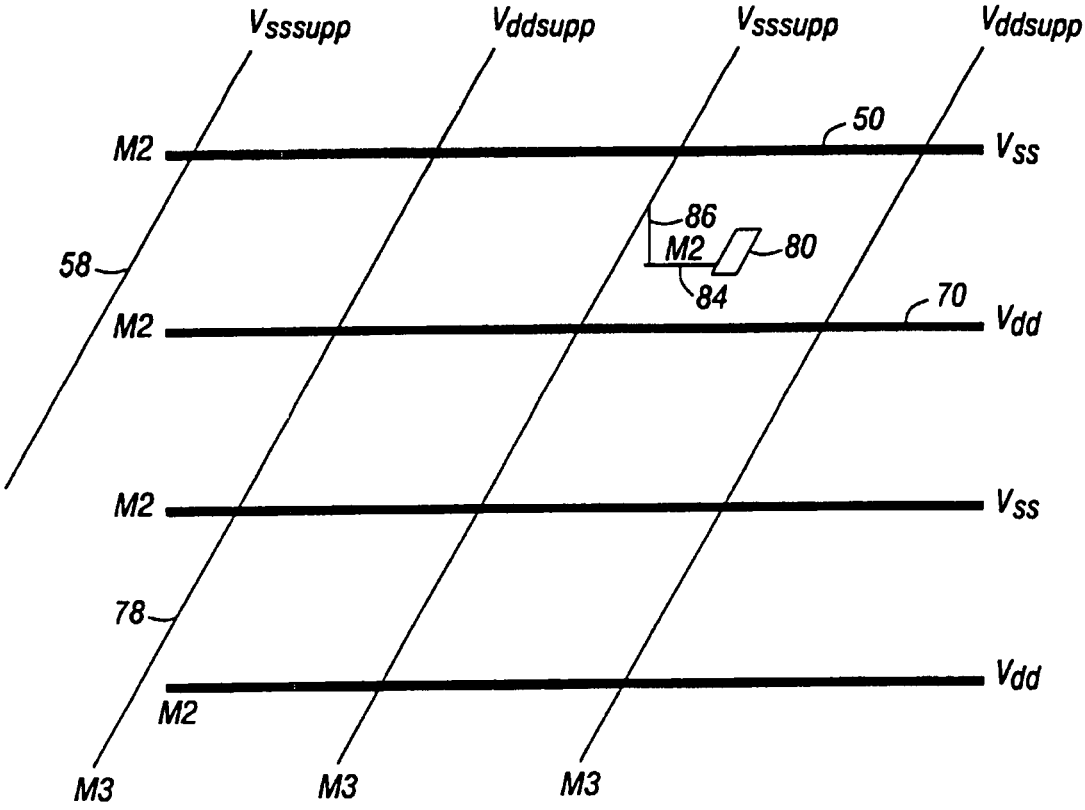
FIG. 11a is a perspective view of a via connecting two metal layers according to one embodiment of the invention.

In FIG. 11a, the power rails 50 and 70 are parallel to one another. In one embodiment of the invention, the power rails 50 and 70 are routed in the M2 layer. The power rails 58 and 78 are orthogonal to the power rails 50 and 70. In one embodiment of the invention, these power rails 58 and 78 are routed in the M3 layer.

Figure 11B:
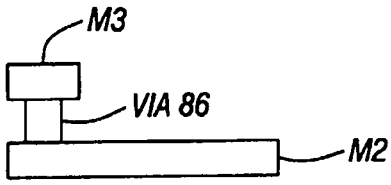
FIG. 11b is a cross-section view of a via connecting two metal layers according to one embodiment of the invention.

However, the tap cells 80 are connected to the power rails 58 and 78. The metal line 84 connecting to the tap cell 80 is formed in the M2 layer. The via 86, a vertical connector of two metal layers, connects the metal line 84 (in M2) to the power rail 58 (in M3). In the cross-sectional view of FIG. 11b, the via 86 is between the M2 and the M3 layers.

Another fabrication issue arises from the addition of the power rails 58 and 78. Recall that, in conventional integrated circuit designs, the p-type substrate 40 is biased with the power rail 50 (FIG. 1), for a potential of $V_{ss}$. Every standard cell circuit 90 in the integrated circuit 100 is connected to both $V_{ss}$ and to $V_{dd}$. When connections to the terminals of a MOSFET are etched during fabrication, electrostatic discharge may build up sufficient charge to damage or destroy the gate of the transistor.

Figure 12:
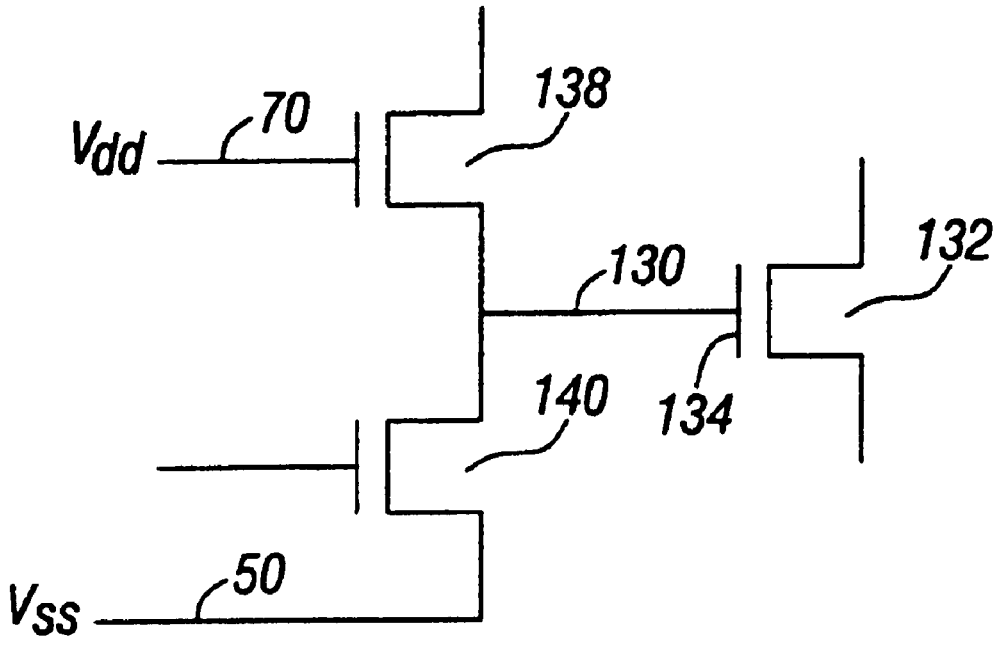
FIG. 12 is a diagram of some transistors according to one embodiment of the invention.

In FIG. 12, a transistor 132 includes a gate 134 connected to a transistor 138 and a transistor 140. A line 130 couples to the source of the transistor 138 and the drain of the transistor 140 to the gate 134 of the transistor 132. During the etching of the line 130, electrostatic charge may build up. If sufficient electrostatic charge builds up, with no way to discharge, the transistor 132 may be destroyed.

The likelihood of destroying the transistor 132 may be predicted by calculating the area of the line 130, the area of the gate 134, and taking a ratio of the two. In one process technology, if the ratio exceeds a predetermined value, the transistor 132 may be destroyed.

The electrostatic discharge problem, however, does not arise if the charge being built up on the line 130 has a path to the p-type substrate 40 (which is, in effect, ground). In FIG. 12, the electrostatic discharge can pass through the transistor 140 to $V_{ss}$ before destroying the transistor 132. Because virtually all the cell circuits 90 of the integrated circuit 120 are connected to $V_{ss}$, a path to the p-type substrate 40 is assured.

The power rails 58 and 78, however, bias the p-type substrate 40 differently. The p-type substrate 40 is no longer biased to $V_{ss}$, but instead is biased to $V_{sssupp}$.

Conventionally, a node area check, or NAC, protection device, may be incorporated into a design to prevent electrostatic discharge from destroying one or more transistors during fabrication. However, conventional design tools such as automatic routing tools may not properly determine where NAC protection devices are appropriate, particularly where additional power rails 58 and 78 are used.

Accordingly, in one embodiment of the invention, NAC protection devices are incorporated into the tap cells 80. Looking back to FIG. 6, recall that the tap cell 80 includes both the substrate tap 56a and the well tap 76a of FIGS. 3 and 4, respectively. In the well tap 56a, the heavily doped n-type region 74 is connected to the power rail 78. Likewise, for the substrate tap 76a, the heavily doped p-type region 54 is connected to the power rail 58.

Figure 13:
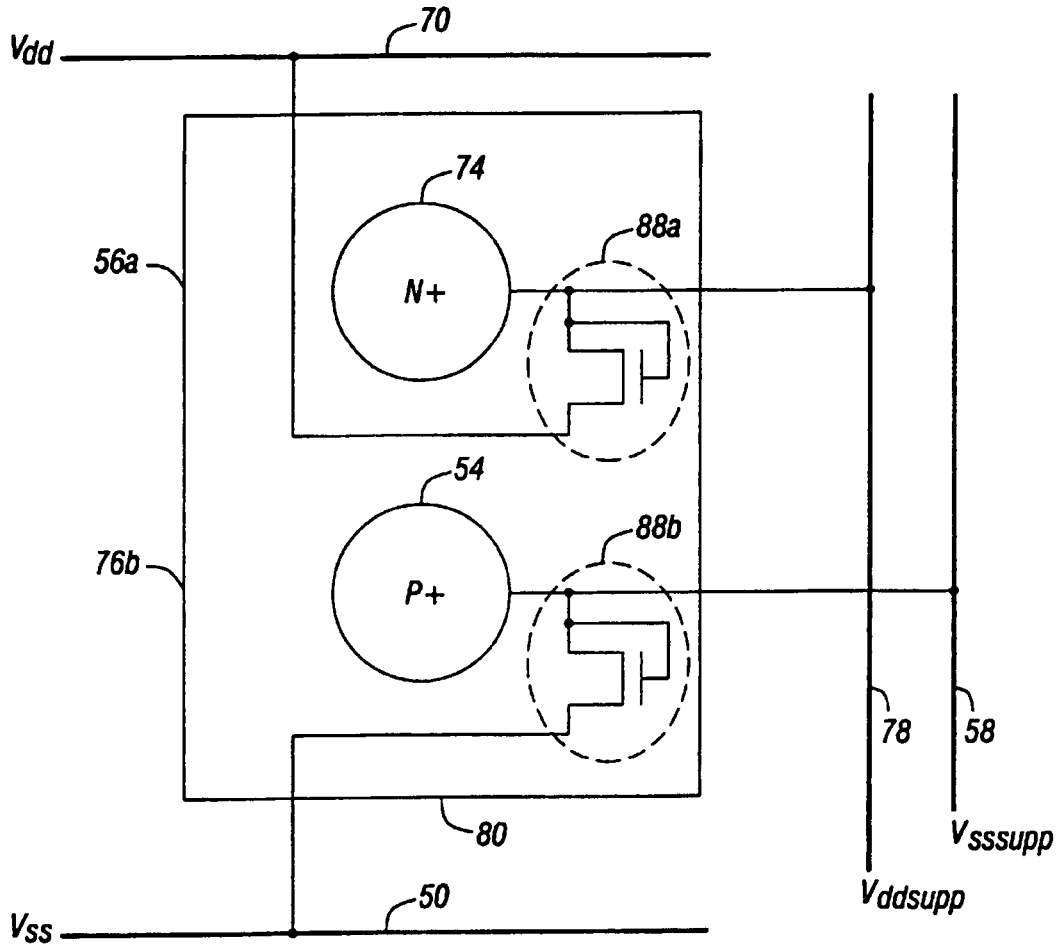
FIG. 13 is a diagram of the tap cell of FIG. 6, including electrostatic discharge protection circuitry according to one embodiment of the invention.

In addition to reducing leakage from the transistors, the tap cell 80 may be used for protection against electrostatic buildup during the fabrication of the integrated circuit 120. Turning to FIG. 13, the tap cell 80, introduced in FIG. 6, includes the heavily doped p-type region 54 and the heavily doped n-type region 74, connected to the power rail 58 and the power rail 78, respectively.

The drain of a transistor 88a is connected to the power rail 78. The source of the transistor 88a is connected to the power rail 70, which runs orthogonally to the power rail 78, in one embodiment of the invention. Using the NAC protection device 88a during the fabrication process, a transistor to which connections are etched has a path from the power rail 70 to the power rail 78.

The tap cell 80 also includes a second NAC protection device 88b. The NAC protection device 88b is connected to the power rail 58 at the drain. The source is connected to the power rail 50. During fabrication, any standard cell connected to the power rail 50 has a path to the power rail 58, thus preventing a transistor from being destroyed due to electrostatic buildup.

Figure 14:
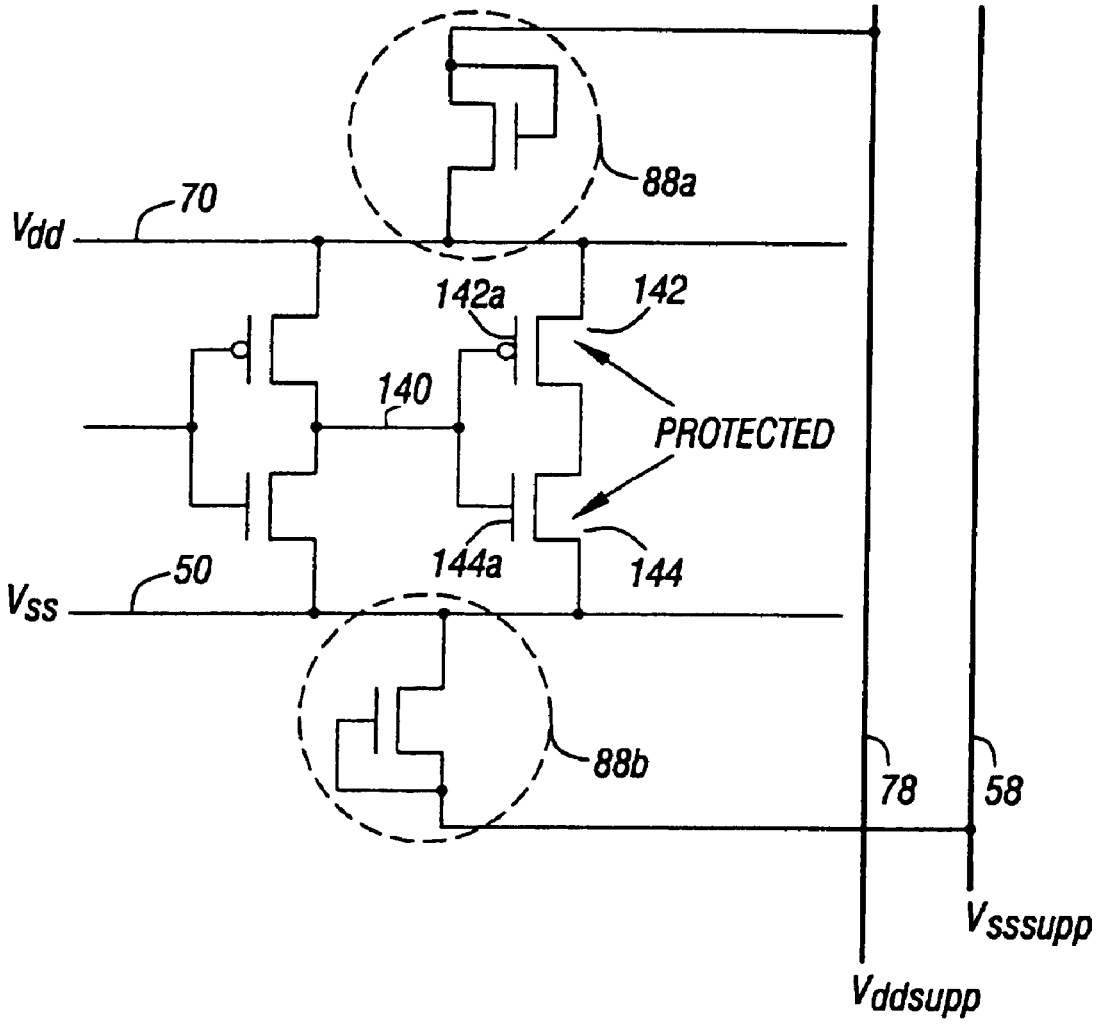
FIG. 14 is a diagram of the electrostatic discharge protection circuitry in an integrated circuit according to one embodiment of the invention.

In FIG. 14, the NAC protection devices 88a and 88b prevent the destruction of gate dielectric during fabrication. A metal line 140, during its creation, builds up electrostatic charge. A transistor 142 includes a gate 142a. Likewise, a transistor 144 includes a gate 144a. During the etching of the metal line 140, both the gate 142a and the gate 144a are at risk if the built-up charge has no path to the p-type substrate 40.

The NAC protection device 88b, however, provides a path for the electrostatic discharge to follow. By making a connection between the power rail 50 and the power rail 58, the built-up current may discharge to the p-type substrate 40. The gates 142a and 144a are thus protected.

Thus, in accordance with some embodiments of the invention, in an integrated circuit design, tap cells are placed outside of cell circuits for connection to power rails which do not connect to the cell circuits. The tap cells may bias the substrate and the well. Feed-throughs for the power rails are provided for efficient automatic placement of the tap cells as well as efficient use of metal for connecting the tap cells to the new power rails. Additional transistors are placed inside the tap cells, where needed, such that electrostatic charge built up during fabrication does not destroy gate dielectrics.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:

a well of a first type comprising a first plurality of regions;

a substrate of a second type comprising a second plurality of regions;

*a first plurality of circuits formed on the well;* a *second* plurality of circuits formed on the substrate;

a first potential coupled to *and powering* the *first* plurality of circuits;

a second potential coupled to *and powering* the *second* plurality of circuits;

a third potential coupled to *and biasing* the first plurality of regions such that the well has the third potential; and a fourth potential coupled to *and biasing* the second plurality of regions such that the substrate has the fourth potential.

2. The apparatus of claim 1, wherein the first potential is a lower voltage than the third potential.

3. The apparatus of claim 1, wherein the second potential is a [lower] *higher* voltage than the fourth potential.

4. The apparatus of claim 1, wherein the first plurality of regions are 55 microns apart.

5. The apparatus of claim 1, further comprising:

a first transistor coupled between the first potential and the third potential; and a second transistor coupled between the second potential and the fourth potential.

6. The apparatus of claim 5, wherein the first plurality of regions and the second plurality of regions are combined as tap cells.

7. The apparatus of claim 6, wherein the tap cells comprise the first and the second transistors.

8. The apparatus of claim 1, wherein the substrate is of a p-type material and the well is of an n-type material.

* * * * *